United States Patent
Munekawa et al.

(10) Patent No.: US 11,724,341 B2
(45) Date of Patent: Aug. 15, 2023

(54) LEAD-FREE SOLDER ALLOY, SOLDER JOINING MATERIAL, ELECTRONIC CIRCUIT MOUNTING SUBSTRATE, AND ELECTRONIC CONTROL DEVICE

(71) Applicant: TAMURA CORPORATION, Tokyo (JP)

(72) Inventors: Yurika Munekawa, Iruma (JP); Takeshi Nakano, Iruma (JP); Masaya Arai, Iruma (JP); Takanori Shimazaki, Iruma (JP); Tsukasa Katsuyama, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 17/022,090

(22) Filed: Sep. 16, 2020

(65) Prior Publication Data

US 2021/0001433 A1    Jan. 7, 2021

Related U.S. Application Data

(63) Continuation of application No. PCT/JP2019/048406, filed on Dec. 11, 2019.

(30) Foreign Application Priority Data

Dec. 25, 2018 (JP) ................. 2018-240674

(51) Int. Cl.
  *B23K 35/26* (2006.01)
  *H05K 3/34* (2006.01)
  *H01L 23/00* (2006.01)

(52) U.S. Cl.
  CPC ............ *B23K 35/262* (2013.01); *H01L 24/13* (2013.01); *H05K 3/3485* (2020.08); *H01L 2924/014* (2013.01)

(58) Field of Classification Search
  CPC ... H01L 23/00; H01L 2924/014; H01L 24/13; H05K 3/3485; B23K 35/262
  (Continued)

(56) References Cited

U.S. PATENT DOCUMENTS

2012/0175020 A1    7/2012   Imamura et al.
2015/0305167 A1   10/2015   Nakanishi et al.
(Continued)

FOREIGN PATENT DOCUMENTS

CN    101508062    8/2009
CN    101801588    8/2010
(Continued)

OTHER PUBLICATIONS

Written Opinion for corresponding International Application No. PCT/JP2019/048406, dated Mar. 10, 2020.
(Continued)

*Primary Examiner* — Tremesha S Willis
(74) *Attorney, Agent, or Firm* — Mori & Ward, LLP (57) ABSTRACT

A lead-free solder alloy includes 2.0% by mass or more and 4.0% by mass or less of Ag, 0.3% by mass or more and 0.7% by mass or less of Cu, 1.2% by mass or more and 2.0% by mass or less of Bi, 0.5% by mass or more and 2.1% by mass or less of In, 3.0% by mass or more and 4.0% by mass or less of Sb, 0.001% by mass or more and 0.05% by mass or less of Ni, 0.001% by mass or more and 0.01% by mass or less of Co, and the balance being Sn.

7 Claims, 1 Drawing Sheet

(58) Field of Classification Search
USPC .......................................................... 174/257
See application file for complete search history.

(56) References Cited

U.S. PATENT DOCUMENTS

| | | | |
|---|---|---|---|
| 2016/0279741 A1 | 9/2016 | Ukyo et al. | |
| 2018/0029169 A1 | 2/2018 | Arai et al. | |
| 2020/0070287 A1* | 3/2020 | Mutuku | B23K 35/264 |

FOREIGN PATENT DOCUMENTS

| | | |
|---|---|---|
| CN | 105142856 | 12/2015 |
| CN | 106001978 | 10/2016 |
| CN | 107107278 | 8/2017 |
| CN | 107214430 | 9/2017 |
| CN | 107427969 | 12/2017 |
| CN | 108500499 | 9/2018 |
| CN | 108994480 | 12/2018 |
| JP | 3027441 B2 | 3/1993 |
| JP | 3353662 B2 | 3/1999 |
| JP | 2017-170527 | 9/2017 |
| JP | 2018-518368 | 7/2018 |
| WO | WO 2012/056753 | 5/2012 |
| WO | WO 2016/179358 | 11/2016 |
| WO | WO 2017/154957 | 9/2017 |
| WO | WO 2017/164194 | 9/2017 |
| WO | WO 2018/067426 | 4/2018 |
| WO | WO 2018/164171 | 9/2018 |

OTHER PUBLICATIONS

International Search Report for corresponding International Application No. PCT/JP2019/048406, dated Mar. 10, 2020.
Translation of Written Opinion of the International Searching Authority for corresponding International Application No. PCT/JP2019/048406, dated Mar. 10, 2020.
Chinese Office Action for corresponding CN Application No. 201980015760.0, dated Apr. 2, 2022 (w/ English machine translation).
Chinese Office Action for corresponding CN Application No. 201980015760.0, dated Oct. 8, 2022 (w/ English machine translation).
Extended European Search Report for corresponding EP Application No. 19905925.4-1103, dated Aug. 9, 2022.
Chinese Office Action for corresponding CN Application No. 201980015760.0, dated Feb. 18, 2023 (w/ English machine translation).
Decision of Rejection for corresponding CN Application No. 2019800157600, dated May 18, 2023 (w/ English machine translation)

* cited by examiner

LEAD-FREE SOLDER ALLOY, SOLDER JOINING MATERIAL, ELECTRONIC CIRCUIT MOUNTING SUBSTRATE, AND ELECTRONIC CONTROL DEVICE

CROSS-REFERENCE TO RELATED APPLICATIONS

The present application is a continuation application of International Application No. PCT/JP2019/048406, filed Dec. 11, 2019, which claims priority to Japanese Patent Application No. 2018-240674 filed Dec. 25, 2018. The contents of these applications are incorporated herein by reference in their entirety.

BACKGROUND

Technical Field

The present invention relates to a lead-free solder alloy, a solder joining material, an electronic circuit mounting substrate, and an electronic control device.

Background Art

There is a solder joining method using a solder alloy as a method for joining an electronic component to a conductor pattern formed on an electronic circuit substrate such as a printed wiring board or a modular substrate. Formerly, lead was used for the solder alloy. However, the use of lead has been restricted by the RoHS directive, etc. from the viewpoint of the environmental load; thus, in these days, solder joining methods using so-called a lead-free solder alloys not comprising lead are becoming common.

As the lead-free solder alloy, for example, solder alloys based on Sn—Cu, Sn—Ag—Cu, Sn—Bi, and Sn—Zn, and the like are well known. An electronic circuit mounting substrate in which solder joined using Sn-3Ag-0.5Cu solder alloy, among the above (a solder joint is formed using Sn-3Ag-0.5Cu solder alloy) is frequently used for consumer electronic devices such as televisions, mobile phones, and smartphones.

Here, the lead-free solder alloy is a little poorer in solderability than lead-comprising solder alloys. However, this problem of solderability has been overcome by improvements of flux and soldering apparatus; thus, even solder joining used Sn-3Ag-0.5Cu solder alloy can keep a certain level of reliability of an electronic circuit mounting substrate placed in a relatively calm environment, such as a consumer electronic device.

Here, what is called an on-vehicle electronic circuit mounting substrate installed in an automobile is used also for an electronic control device that controls devices such as an engine, a power steering device, a brake, and an air bag. The functions of these devices are very important ones that affect not only the running of the automobile but also human life. Hence, as compared to electronic circuit mounting substrates used for consumer electronic devices, the on-vehicle electronic circuit mounting substrate is required to have very high reliability, and is desired to maintain the reliability over a long period of time.

Further, among on-vehicle electronic circuit mounting substrates, particularly an on-vehicle electronic circuit mounting substrate used for an electronic control device that controls an engine may be exposed to a very severe environment due to being mounted in the engine room, being directly installed on the engine, etc.

That is, such a substrate is exposed to a high temperature environment near 100° C. to 150° C. during the running of the engine, and yet may be exposed to a low temperature environment near −30° C. to −40° C. particularly in the winter season in a cold district because the ambient temperature at the time when the engine is shut down is affected by the temperature of the outside air. Thus, the on-vehicle electronic circuit mounting substrate continues to be exposed to a severe temperature variations (from −40° C. to 150° C.) due to the repeating of running and shutting down of the engine.

In addition, in recent years, the numbers of devices and electronic control devices installed in an automobile increase more and more, but on the other hand, there is a limit to the space for installing these; thus, there is a tendency for the downsizing of the devices and the electronic control devices to be desired more.

Accordingly, also the downsizing of the on-vehicle electronic circuit mounting substrate, and the improvement in performance and the downsizing of electronic components to be installed on the on-vehicle electronic circuit mounting substrate are advanced more. Hence, such an on-vehicle electronic circuit mounting substrate has a concern that the heat generation density will be increased more and the substrate will be exposed to a higher temperature environment.

Thus, the on-vehicle electronic circuit mounting substrate in the future is required to have higher heat resistance, and accordingly also a lead-free solder alloy used for the substrate is desired to exhibit higher thermal fatigue resistance properties, for example thermal fatigue resistance properties in a very severe temperature variations from −40° C. to 175° C.

Further, in an environment with a very severe temperature variations like that described above, it is expected that, in the electronic circuit mounting substrate, the load on the solder joint due to thermal stress caused by the difference in linear expansion coefficient between the mounted electronic component and the substrate (in the present specification, the simple word of "substrate" refers to any one of a board before a conductor pattern is formed, a board on which a conductor pattern is formed and that can be electrically connected to electronic components, and a board portion not including electronic components of an electronic circuit mounting substrate on which the electronic components are mounted, and refers to any of these in accordance with the circumstances, as appropriate; in this case, the substrate refers to "a board portion not including electronic components of an electronic circuit mounting substrate on which the electronic components are mounted") will be further increased.

In particular, such a load repeatedly given to the solder joint in the course of the use of the automobile brings about plastic deformation of the solder joint, and is therefore a cause of the occurrence of a crack in the solder joint; thus, there is a concern that such a crack is more likely to occur than before.

Furthermore, due to a load being repeatedly given to the solder joint described above, stress concentrates near an end of a crack that has occurred in the solder joint; hence, the crack that has occurred is likely to progress transversely up to a deep portion of the solder joint. The progress of the crack may be still more likely to occur particularly in a very severe environment such as one with a temperature variations from −40° C. to 175° C.

A crack that has considerably progressed in this way brings about cutting of the electrical connection between the electronic component and the conductor pattern formed on the substrate.

Further, in an environment where, in addition to a very severe temperature variations like that described above, vibration is loaded on the electronic circuit mounting substrate, there is a problem that such a crack and its progress are still more likely to occur.

Some methods are disclosed in which, for the purpose of suppressing the progress of a crack of a solder joint like that mentioned above, Sb is added to Sn—Ag—Cu-based solder alloy in order to improve the thermal fatigue properties and the strength (see, for example, JP 3027441 B2 and JP 3353662 B2).

Sb can be dissolved as a solid solution in the Sn matrix of the solder alloy to exhibit the effect of suppressing the progress of a crack of the lead-free solder alloy; however, depending on the content and the balance with other alloy elements, Sb has a concern that a void is likely to occur in the solder joint formed using the solder alloy. Thus, in the case where such a solder joint is placed in an environment with a very severe temperature variations, for example from −40° C. to 175° C., there is a concern that a crack will occur due to a void that has occurred in the solder joint and the crack will progress.

Sb is an alloy element that raises the solidus temperature and the liquidus temperature of the solder alloy; hence, depending on the content and the balance with other alloy elements, Sb has a concern that the solidus temperature and the liquidus temperature of the solder alloy will rise excessively. In such a case, the solder alloy may unmelt under certain heating conditions at the time of soldering.

SUMMARY

According to one aspect of the embodiment, a lead-free solder alloy includes 2.0% by mass or more and 4.0% by mass or less of Ag, 0.3% by mass or more and 0.7% by mass or less of Cu, 1.2% by mass or more and 2.0% by mass or less of Bi, 0.5% by mass or more and 2.1% by mass or less of In, 3.0% by mass or more and 4.0% by mass or less of Sb, 0.001% by mass or more and 0.05% by mass or less of Ni, 0.001% by mass or more and 0.01% by mass or less of Co, and the balance being Sn.

According to another aspect of the embodiment, a solder joining material includes the lead-free solder alloy described above.

According to further aspect of the embodiment, a solder paste includes the lead-free solder alloy described above in a powder form, and a flux including a base resin, a thixotropic agent, an activator, and a solvent.

According to the other aspect of the embodiment, an electronic circuit mounting substrate includes a solder joint formed using the lead-free solder alloy described above.

According to further aspect of the embodiment, an electronic control device includes the electronic circuit mounting substrate described above.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

The embodiments will now be described with reference to the accompanying drawings, wherein like reference numerals designate corresponding or identical elements throughout the various drawings.

Hereinbelow, an embodiments of a lead-free solder alloy, a solder joining material, an electronic circuit mounting substrate, and an electronic control apparatus of the present invention are described in detail. The present invention will not be limited to the following embodiments.

(1) Lead-Free Solder Alloy

A lead-free solder alloy of the present embodiment is allowed to comprise 2.0% by mass or more and 4.0% by mass or less of Ag.

By adding Ag to the lead-free solder alloy within this range, a $Ag_3Sn$ compound can be precipitated in the Sn grain boundary to impart mechanical strength while the ductility of the lead-free solder alloy is kept good. Further, thereby, the thermal shock resistance and the thermal fatigue resistance properties of the lead-free solder alloy can be improved, and therefore the effect of suppressing the progress of a crack in the solder joint formed using the alloy can be exhibited. Further, the lead-free solder alloy of the present embodiment can suppress the occurrence of a void in the solder joint.

A more preferred amount of Ag is 2.5% by mass or more and 4.0% by mass or less, a still more preferred amount of Ag is 2.8% by mass or more and 4.0% by mass or less, and a particularly preferred amount of Ag is 2.8% by mass or more and 3.5% by mass or less.

Specifically, the lower limit value of the amount of Ag is preferably 2.5% by mass, is more preferably 2.8% by mass, and is still more preferably 3.0% by mass.

Further, the upper limit value of the amount of Ag is preferably 4.0% by mass, and is more preferably 3.5% by mass.

By setting the amount of Ag within this range, a balance of the effect of suppressing the progress of a crack in the solder joint and the effect of suppressing the occurrence of a void can be achieved more.

A lead-free solder alloy of the present embodiment is allowed to comprise 0.3% by mass or more and 0.7% by mass or less of Cu.

By adding Cu to the lead-free solder alloy within this range, a $Cu_6Sn_5$ compound can be precipitated in the Sn grain boundary, and the thermal shock resistance and the thermal fatigue resistance properties of the lead-free solder alloy can be improved. Further, by setting the amount of Cu within this range, the effect of suppressing the progress of a crack in the solder joint formed using the alloy can be improved, and also the occurrence of a void in the joint can be suppressed, without inhibiting the ductility of the lead-free solder alloy.

A more preferred amount of Cu is 0.5% by mass or more and 0.7% by mass or less, and a still more preferred amount of Cu is 0.6% by mass or more and 0.7% by mass or less.

Specifically, the lower limit value of the amount of Cu is preferably 0.3% by mass, is more preferably 0.5% by mass, and is still more preferably 0.6% by mass.

Further, the upper limit value of the amount of Cu is preferably 0.7% by mass.

By setting the amount of Cu within this range, a balance of the effect of suppressing the progress of a crack in the solder joint and the effect of suppressing the occurrence of a void can be achieved more.

A lead-free solder alloy of the present embodiment is allowed to comprise 1.2% by mass or more and 2.0% by mass or less of Bi.

By adding Bi to the lead-free solder alloy within this range, the mechanical strength and the thermal fatigue resistance properties of the lead-free solder alloy can be improved while the solidus temperature of the alloy is kept at a certain level or more, without influencing the ductility.

That is, Bi can be dissolved as a solid solution in the Sn matrix of the lead-free solder alloy to further strengthen the lead-free solder alloy, but may reduce the solidus temperature of the lead-free solder alloy, depending on the content; thus, in the case where a solder joint formed using such a lead-free solder alloy is placed in an environment with a very severe temperature variations, for example from −40° C. to 175° C., there is a concern that the solder joint will remelt and will reduce the thermal shock resistance. Further, depending on the content, the ductility of the lead-free solder alloy is inhibited; thus, in the case of being placed in an environment with a very severe temperature variations like that described above, there is a concern that breaking will occur in the solder joint.

However, by achieving a balance between the amount of Bi, and the amounts of In and Sb described later, the lead-free solder alloy of the present embodiment can set the solidus temperature to a certain level or more as described above, and can exhibit solid solution strengthening by Bi. Thereby, the lead-free solder alloy of the present embodiment can exhibit good ductility, thermal fatigue resistance properties, and the effect of suppressing the progress of a crack in the solder joint formed using the alloy, and can exhibit also the effect of suppressing the occurrence of a void in the solder joint.

A more preferred amount of Bi is 1.5% by mass or more and 2.0% by mass or less, and a still more preferred amount of Bi is 1.7% by mass or more and 2.0% by mass or less.

Specifically, the lower limit value of the amount of Bi is preferably 1.2% by mass, is more preferably 1.5% by mass, and is still more preferably 1.7% by mass.

Further, the upper limit value of the amount of Bi is preferably 2.0% by mass.

A lead-free solder alloy of the present embodiment is allowed to comprise 0.5% by mass or more and 2.1% by mass or less of In.

By adding In to the lead-free solder alloy within this range, while the solidus temperature of the lead-free solder alloy is kept at a certain level or more, the thermal fatigue resistance properties of the lead-free solder alloy can be improved, a good effect of suppressing the progress of a crack in the solder joint formed using the alloy can be exhibited, and the effect of suppressing the occurrence of a void in the joint can be exhibited.

That is, similarly to Bi, In can be dissolved as a solid solution in the Sn matrix of the lead-free solder alloy to further strengthen the lead-free solder alloy; however, depending on the content, In has a concern that a void is likely to occur in the solder joint formed using the lead-free solder alloy. Thus, in the case where such a solder joint is placed in an environment with a severe temperature variations, for example from −40° C. to 175° C., there is a concern that a crack will occur due to a void that has occurred in the solder joint and the crack will progress.

However, by achieving a balance between the amount of In, and the amounts of Bi and Sb described later, the lead-free solder alloy of the present embodiment can set the solidus temperature to a certain level or more as described above, and can exhibit solid solution strengthening by In. Thereby, the lead-free solder alloy of the present embodiment can have good mechanical strength without ductility being inhibited. Therefore, the good thermal fatigue resistance properties and the effect of suppressing the progress of a crack can be exhibited in the solder joint formed using the alloy, and also the effect of suppressing the occurrence of a void can be exhibited in the solder joint.

A more preferred amount of In is 0.75% by mass or more and 2.0% by mass or less, and a still more preferred amount of In is 1% by mass or more and 1.5% by mass or less.

Specifically, the lower limit value of the amount of In is preferably 0.5% by mass, is more preferably 0.75% by mass, and is still more preferably 1.0% by mass.

Further, the upper limit value of the amount of In is preferably 2.1% by mass, is more preferably 2.0% by mass, and is still more preferably 1.5% by mass.

A lead-free solder alloy of the present embodiment is allowed to comprise 3.0% by mass or more and 4.0% by mass or less of Sb.

By adding Sb to the lead-free solder alloy within this range, the solder joint formed can be strengthened by solid solution strengthening without influencing the ductility of the lead-free solder alloy.

That is, similarly to Bi and In, Sb can be dissolved as a solid solution in the Sn matrix of the lead-free solder alloy to further strengthen the lead-free solder alloy; however, depending on the content, Sb has a concern that a void is likely to occur in the solder joint formed using the lead-free solder alloy. Thus, in the case where such a solder joint is placed in an environment with a severe temperature variations, for example from −40° C. to 175° C., there is a concern that a crack will occur due to a void that has occurred in the solder joint and the crack will progress.

However, by achieving a balance between the amount of Sb, and the amounts of Bi and In, the lead-free solder alloy of the present embodiment can exhibit solid solution strengthening by Sb. Thereby, the lead-free solder alloy of the present embodiment can have good mechanical strength without ductility being inhibited. Therefore, the good thermal fatigue resistance properties and the effect of suppressing the progress of a crack can be exhibited in the solder joint formed using the alloy, and also the effect of suppressing the occurrence of a void can be exhibited in the solder joint.

A more preferred amount of Sb is 3.0% by mass or more and 3.8% by mass or less, and a still more preferred amount of Sb is 3.0% by mass or more and 3.5% by mass or less.

Specifically, the lower limit value of the amount of Sb is preferably 3.0% by mass, is more preferably 3.2% by mass, and is still more preferably 3.4% by mass.

Further, the upper limit value of the amount of Sb is preferably 4.0% by mass, is more preferably 3.8% by mass, and is still more preferably 3.5% by mass.

Thus, by achieving a balance between the amounts of Bi, In, and Sb and a balance between the amounts of other alloy elements and Bi, In, and Sb, the lead-free solder alloy of the present embodiment can exhibit good ductility, thermal fatigue resistance properties, and the effect of suppressing the progress of a crack, and can exhibit also the effect of suppressing the occurrence of a void in the solder joint, while keeping the solidus temperature of the lead-free solder alloy at a certain level or more.

A lead-free solder alloy of the present embodiment is allowed to comprise 0.001% by mass or more and 0.05% mass or less of Ni.

By adding Ni to the lead-free solder alloy, fine $(Cu, Ni)_6Sn_5$ can be formed in the lead-free solder alloy that is melted during soldering, and can be dispersed in the solder joint; therefore, the progress of a crack in the solder joint can be suppressed, and furthermore the thermal fatigue resistance properties can be improved.

Further, during soldering, Ni comprised in the lead-free solder alloy can move to the interface between the electrode of the electronic component and the solder joint (hereinafter, referred to as an "interface region"), and can form fine $(Cu, Ni)_6Sn_5$. Therefore, the growth of an alloy layer in the interface region can be suppressed, and the progress of a crack in the interface region can be suppressed.

By adding Ni within the range mentioned above, the lead-free solder alloy of the present embodiment can exhibit a good effect of suppressing the progress of a crack in the interface region, and can exhibit the effect of suppressing the occurrence of a void in the solder joint.

A more preferred amount of Ni is 0.01% by mass or more and 0.05% by mass or less, and a still more preferred amount of Ni is 0.03% by mass or more and 0.05% by mass or less.

Specifically, the lower limit value of the amount of Ni is preferably 0.001% by mass, is more preferably 0.01% by mass, and is still more preferably 0.03% by mass.

Further, the upper limit value of the amount of Ni is preferably 0.05% by mass, and is more preferably 0.04% by mass.

A lead-free solder alloy of the present embodiment is allowed to comprise 0.001% by mass or more and 0.01% by mass or less of Co, along with Ni.

By further adding Co to the lead-free solder alloy, the effects mentioned above by Ni addition are enhanced, and fine $(Cu, Co)_6Sn_5$ can be formed in the lead-free solder alloy that is melted during soldering, and can be dispersed in the solder joint; therefore, while creep deformation of the solder joint is suppressed and the progress of a crack is suppressed, the thermal fatigue resistance properties of the solder joint particularly in an environment with a severe temperature variations can be improved.

Further, by the addition of Co to the lead-free solder alloy of the present embodiment, during soldering, Co moves to the interface region, and forms fine $(Cu, Co)_6Sn_5$; therefore, the growth of an alloy layer in the interface region can be suppressed, and the effect of suppressing the progress of a crack in the interface region can be further improved.

By comprising Co within the range mentioned above, the lead-free solder alloy of the present embodiment can exhibit a good effect of suppressing the progress of a crack in the interface region, and can exhibit the effect of suppressing the occurrence of a void in the solder joint.

A more preferred amount of Co is 0.003% by mass or more and 0.01% by mass or less, and a still more preferred amount of Ni is 0.008% by mass or more and 0.01% by mass or less.

Specifically, the lower limit value of the amount of Co is preferably 0.001% by mass, is more preferably 0.003% by mass, is still more preferably 0.005% by mass, and more preferably 0.008% by mass.

Further, the upper limit value of the amount of Co is preferably 0.01% by mass.

The lead-free solder alloy of the present embodiment is allowed to comprise at least one of P, Ga, and Ge 0.001% by mass or more and 0.05% by mass or less. By adding at least one of P, Ga, and Ge within this range of the total amount, the oxidation of the lead-free solder alloy can be prevented while the occurrence of a void in the solder joint is suppressed.

The lead-free solder alloy of the present embodiment is allowed to comprise at least one of Fe, Mn, Cr, and Mo 0.001% by mass or more and 0.05% by mass or less. By adding at least one of Fe, Mn, Cr, and Mo within this range of the total amount, the effect of suppressing the progress of a crack in the solder joint can be improved.

The balance of the lead-free solder alloy of the present embodiment is preferably Sn.

By achieving a balance of the alloy elements and the content, the lead-free solder alloy of the present embodiment can set the liquidus temperature to 225° C. or less. In the case where the liquidus temperature of the lead-free solder alloy is 225° C. or less, the alloy can melt sufficiently even when the peak temperature at the time of soldering is set to approximately 230° C. (substantially equal to the peak temperature in conventional lead-free solder alloys), and can therefore be used suitably even for, for example, an electronic circuit mounting substrate on which a large-sized electronic component and a small-sized electronic component coexist.

That is, electronic components have various heat capacities in accordance with the sizes and the materials, and accordingly the heats that are conducted through the electronic components at the time of mounting on the substrate, that is, the heats applied to the electronic components are various. In the case of an electronic circuit mounting substrate on which a large-sized electronic component and a small-sized electronic component coexist, for example like in an electronic circuit mounting substrate used for an engine control unit, the heating temperature at the time of soldering should be set in view of the heat resistances of the electronic components.

In the case of, for example, a large-sized electronic component such as an aluminum electrolytic capacitor, the heat capacity is often larger than in a small-sized electronic component. Hence, when the heating temperature (the ambient temperature) at the time of soldering is set to fit the small-sized electronic component, the heat applied to the large-sized electronic component (the temperature of the electronic component) does not rise much; on the other hand, when the heating temperature is set to fit the large-sized electronic component, the problem that the small-sized electronic component cannot endure arises.

However, a lead-free solder alloy particularly with a liquidus temperature of 225° C. or less can melt sufficiently even when the peak temperature at the time of soldering is set to approximately 230° C.; therefore, can melt sufficiently during heating even in the case where, like in an electronic circuit mounting substrate like the above on which a large-sized electronic component and a small-sized electronic component coexist, there is no choice but to set the heating temperature at the time of soldering to a relatively low value in accordance with the sizes and the materials of the electronic components to be mounted; thus, can ensure the reliability of the solder joint even in such an electronic circuit mounting substrate.

As the method for forming the solder joint of the present embodiment, any method may be used as long as it can form a solder joint, such as a flow method based on the lead-free solder alloy of the present embodiment, mounting based on a solder ball, or a reflow method using a solder joining material comprising the lead-free solder alloy of the present embodiment and a flux, or a solder paste. Among these, a method using a solder paste is preferably used.

(2) Solder Joining Material

As a solder joining material of the present embodiment, for example, a material comprising the lead-free solder alloy mentioned above and a flux is preferably used.

As such a flux, for example, a flux comprising a base resin, a thixotropic agent, an activator, and a solvent is used.

Examples of the base resin comprise rosin-based resins comprising rosin such as tall oil rosin, gum rosin, and wood rosin, and rosin derivatives such as hydrogenated rosin, polymerized rosin, disproportionated rosin, acrylic acid-modified rosin, and maleic acid-modified rosin; an acrylic resin obtained by polymerizing at least one kind of monomer of acrylic acid, methacrylic acid, various esters of acrylic acid, various esters of methacrylic acid, crotonic acid, itaconic acid, maleic acid, maleic anhydride, esters of maleic acid, esters of maleic anhydride, acrylonitrile, methacrylonitrile, acrylamide, methacrylamide, vinyl chloride, vinyl acetate, and the like; epoxy resins; phenolic resins; and the like. Each of these may be used singly, or two or more of these may be used in combination.

Among these, rosin-based resins are preferably used, particularly hydrogenated acid-modified rosin obtained by performing hydrogenation on acid-modified rosin is preferably used. Also combined use of hydrogenated acid-modified rosin and an acrylic resin is preferable.

The acid value of the base resin is preferably 10 mg KOH/g or more and 250 mg KOH/g or less. The blending amount of the base resin is preferably 10% by mass or more and 90% by mass or less relative to the total amount of the flux.

Examples of the thixotropic agent comprise hydrogenated castor oil, fatty acid amides, and oxy-fatty acids. Each of these may be used singly, or two or more of these may be used in combination. The blending amount of the thixotropic agent is preferably 3% by mass or more and 15% by mass or less relative to the total amount of the flux.

As the activator, for example, an amine salt such as a hydrogen halide salt of an organic amine (an inorganic acid salt or an organic acid salt), an organic acid, an organic acid salt, an organic amine salt, or the like may be blended. More specifically, dibromobutenediol, diphenylguanidine hydrobromide, cyclohexylamine hydrobromide, diethylamine salts, acid salts, glutaric acid, succinic acid, adipic acid, sebacic acid, malonic acid, dodecanedioic acid, suberic acid, and the like are given.

Each of these may be used singly, or two or more of these may be used in combination. The blending amount of the activator is preferably 5% by mass or more and 15% by mass or less relative to the total amount of the flux.

As the solvent, for example, isopropyl alcohol, ethanol, acetone, toluene, xylenes, ethyl acetate, ethyl cellosolve, butyl cellosolve, glycol ethers, and the like may be used. Each of these may be used singly, or two or more of these may be used in combination. The blending amount of the solvent is preferably 20% by mass or more and 40% by mass or less relative to the total amount of the flux.

An antioxidant may be blended in the flux for the purpose of suppressing the oxidation of the lead-free solder alloy. Examples of the antioxidant comprise hindered phenol-based antioxidants, phenol-based antioxidants, bisphenol-based antioxidants, polymer-type antioxidants, and the like. Among these, particularly hindered phenol-based antioxidants are preferably used. Each of these may be used singly, or two or more of these may be used in combination. The blending amount of the antioxidant is not particularly limited, but is generally preferably 0.5% by mass % or more and approximately 5.0% by mass or less relative to the total amount of the flux.

Additives such as a halogen, a matting agent, an antifoaming agent, and an inorganic filler may be added to the flux.

The blending amount of such additives is preferably 10% by mass or less relative to the total amount of the flux. A more preferred blending amount of these is 5% by mass or less relative to the total amount of the flux.

(3) Solder Paste

A solder paste is preferably used as the solder joining material of the present embodiment. Such a solder paste is produced by, for example, kneading the lead-free solder alloy prepared in a powder form (an alloy powder) and the flux into a paste form.

In the case where the solder paste is produced, the blending ratio between the alloy powder and the flux is preferably 65:35 to 95:5 in terms of the ratio of the alloy powder:the flux. A more preferred blending ratio is 85:15 to 93:7, and a particularly preferred blending ratio is 87:13 to 92:8.

The particle size of the alloy powder is preferably 1 μm or more and 40 μm or less, more preferably 5 μm or more and 35 μm or less, and particularly preferably 10 μm or more and 30 μm or less.

(4) Solder Joint

A solder joint formed using the solder joining material of the present embodiment is formed by the following method, for example. As the substrate on which the solder joint of the present embodiment is to be formed, any substrate used for the installation or mounting of electronic components may be used, comprising but not limited to a printed wiring board, a silicon wafer, a ceramic package substrate, and the like.

That is, for example, electrodes and insulating layers in a prescribed pattern are formed in predetermined positions on a substrate, and a solder paste is subjected to printing as the solder joining material in agreement with the pattern. Then, electronic components are installed in prescribed positions on the substrate, and the workpiece is subjected to reflow at a temperature of, for example, 220° C. to 245° C.; thus, solder joints of the present embodiment are formed. The solder joint thus formed electrically joins the electrode (terminal) provided on the electronic component and the electrode formed on the substrate.

The solder joint formed using the solder paste (the lead-free solder alloy of the present embodiment) can exhibit good thermal fatigue resistance properties and the effect of suppressing the progress of a crack, and can exhibit also the effect of suppressing the occurrence of a void, even in an environment with a very severe temperature variations, for example from −40° C. to 175° C.

When the liquidus temperature of the lead-free solder alloy used for the solder paste is 225° C. or less, the alloy melts sufficiently even when the peak temperature at the time of reflow is set to approximately 230° C., and a solder joint with high reliability can be formed.

In the case where the lead-free solder alloy of the present embodiment is used as a solder ball, for example, electrodes and insulating layers in a prescribed pattern are formed in predetermined positions on a substrate, a flux is applied to the pattern in agreement with the pattern, and the solder ball is put thereon. Then, electronic components are installed in prescribed positions on the substrate, and the workpiece is subjected to reflow at a temperature of, for example, 220° C. to 245° C.; thus, solder joints of the present embodiment are formed. The solder joint thus formed electrically joins the electrode (terminal) provided on the electronic component and the electrode formed on the substrate.

The solder joint formed using the solder ball can exhibit good thermal fatigue resistance properties and the effect of suppressing the progress of a crack, and can exhibit also the effect of suppressing the occurrence of a void, even in an environment with a very severe temperature variations, for example from −40° C. to 175° C.

When the liquidus temperature of the lead-free solder alloy used for the solder ball is 225° C. or less, the alloy melts sufficiently even when the peak temperature at the time of reflow is set to approximately 230° C., and a solder joint with high reliability can be formed.

Thus, an electronic circuit mounting substrate comprising the solder joint of the present embodiment can be suitably used particularly for an on-vehicle electronic circuit mounting substrate that is placed in an environment with a severe temperature variations and is required to have high reliability.

(5) Electronic Control Device

An electronic control device with high reliability is produced by incorporating such an electronic circuit mounting substrate. Such an electronic control device can be suitably used for an on-vehicle electronic control device that is desired to have particularly high reliability.

EXAMPLES

Hereinafter, the present invention will be described in detail with Examples and Comparative Examples. Note that the present invention is not limited to these Examples.

Preparation of Flux

The following components were kneaded to obtain a flux for Examples and Comparative Examples.

Hydrogenated acid-modified rosin (product name: KE-604; manufactured by Arakawa Chemical Industries, Ltd.): 49.0% by mass Glutaric acid: 0.3% by mass Suberic acid: 2.0% by mass Malonic acid: 0.5% by mass Dodecanedioic acid: 2.0% by mass Dibromobutenediol: 2.0% by mass Fatty acid amide (product name: Slipax ZHH; manufactured by Nihon Kasei CO., LTD): 6.0% by mass Diethylene glycol monohexyl ether: 35.2% by mass Hindered phenol-based antioxidant (product name: Irganox 245; manufactured by BASF JAPAN K.K.): 3.0% by mass Preparation of Solder Paste 11.3% by mass of the flux and 88.7% by mass of powder of the lead-free solder alloys (powder particle size: 20 μm to 38 μm) listed in Table 1 and Table 2 were mixed, thus making the solder paste of Examples and Comparative Examples.

TABLE 1

|  | Sn | Ag | Cu | Bi | In | Sb | Ni | Co | Others |
|---|---|---|---|---|---|---|---|---|---|
| Example 1 | Balance | 2.0 | 0.7 | 2.0 | 2.0 | 3.0 | 0.04 | 0.01 | — |
| Example 2 | Balance | 2.5 | 0.7 | 2.0 | 2.0 | 3.0 | 0.04 | 0.01 | — |
| Example 3 | Balance | 2.8 | 0.7 | 2.0 | 2.0 | 3.0 | 0.04 | 0.01 | — |
| Example 4 | Balance | 3.5 | 0.7 | 2.0 | 2.0 | 3.0 | 0.04 | 0.01 | — |
| Example 5 | Balance | 4.0 | 0.7 | 2.0 | 2.0 | 3.2 | 0.04 | 0.01 | — |
| Example 6 | Balance | 3.0 | 0.3 | 2.0 | 1.0 | 3.2 | 0.04 | 0.01 | — |
| Example 7 | Balance | 3.0 | 0.5 | 2.0 | 1.0 | 3.2 | 0.04 | 0.01 | — |
| Example 8 | Balance | 3.0 | 0.6 | 2.0 | 1.0 | 3.2 | 0.04 | 0.01 | — |
| Example 9 | Balance | 3.0 | 0.7 | 2.0 | 1.0 | 3.2 | 0.04 | 0.01 | — |
| Example 10 | Balance | 3.0 | 0.7 | 1.2 | 1.5 | 3.0 | 0.04 | 0.005 | — |
| Example 11 | Balance | 3.0 | 0.7 | 1.5 | 1.5 | 3.0 | 0.04 | 0.01 | — |
| Example 12 | Balance | 3.0 | 0.7 | 2.0 | 0.5 | 3.0 | 0.04 | 0.01 | — |
| Example 13 | Balance | 3.0 | 0.7 | 2.0 | 0.75 | 3.0 | 0.05 | 0.01 | — |
| Example 14 | Balance | 3.0 | 0.7 | 1.5 | 1.5 | 3.4 | 0.04 | 0.008 | — |
| Example 15 | Balance | 3.0 | 0.7 | 2.0 | 2.1 | 3.0 | 0.04 | 0.01 | — |
| Example 16 | Balance | 3.0 | 0.7 | 2.0 | 1.0 | 3.0 | 0.04 | 0.01 | — |
| Example 17 | Balance | 3.0 | 0.7 | 2.0 | 1.5 | 3.5 | 0.04 | 0.01 | — |
| Example 18 | Balance | 3.0 | 0.7 | 1.5 | 2.0 | 3.8 | 0.04 | 0.008 | — |
| Example 19 | Balance | 3.0 | 0.7 | 2.0 | 1.5 | 4.0 | 0.04 | 0.01 | — |
| Example 20 | Balance | 3.0 | 0.7 | 2.0 | 1.5 | 3.5 | 0.001 | 0.01 | — |
| Example 21 | Balance | 3.0 | 0.7 | 2.0 | 1.0 | 3.0 | 0.01 | 0.01 | — |
| Example 22 | Balance | 3.0 | 0.7 | 2.0 | 1.0 | 3.0 | 0.03 | 0.008 | — |
| Example 23 | Balance | 3.0 | 0.7 | 2.0 | 1.0 | 3.0 | 0.05 | 0.008 | — |
| Example 24 | Balance | 3.0 | 0.7 | 2.0 | 2.0 | 4.0 | 0.04 | 0.001 | — |
| Example 25 | Balance | 3.0 | 0.7 | 2.0 | 1.0 | 3.0 | 0.04 | 0.003 | — |
| Example 26 | Balance | 3.0 | 0.7 | 2.0 | 1.0 | 3.0 | 0.04 | 0.005 | — |
| Example 27 | Balance | 3.0 | 0.7 | 1.5 | 1.5 | 3.4 | 0.04 | 0.01 | 0.05 P |
| Example 28 | Balance | 3.0 | 0.7 | 1.5 | 1.5 | 3.4 | 0.04 | 0.01 | 0.05 Ge |
| Example 29 | Balance | 3.0 | 0.7 | 1.5 | 1.5 | 3.4 | 0.04 | 0.01 | 0.05 Ga |
| Example 30 | Balance | 3.0 | 0.7 | 1.5 | 1.5 | 3.4 | 0.04 | 0.01 | 0.05 Fe |
| Example 31 | Balance | 3.0 | 0.7 | 1.5 | 1.5 | 3.4 | 0.04 | 0.01 | 0.05 Mn |
| Example 32 | Balance | 3.0 | 0.7 | 1.5 | 1.5 | 3.4 | 0.04 | 0.01 | 0.05 Cr |
| Example 33 | Balance | 3.0 | 0.7 | 1.5 | 1.5 | 3.4 | 0.04 | 0.01 | 0.05 Mo |

TABLE 2

|  | Sn | Ag | Cu | Bi | In | Sb | Ni | Co | Others |
|---|---|---|---|---|---|---|---|---|---|
| Comparative Example 1 | Balance | 1.5 | 0.7 | 2.0 | 1.0 | 3.2 | 0.03 | 0.01 | — |
| Comparative Example 2 | Balance | 4.5 | 0.7 | 1.5 | 1.5 | 3.0 | 0.04 | 0.01 | — |
| Comparative Example 3 | Balance | 3.0 | 0.1 | 1.5 | 1.5 | 3.0 | 0.04 | 0.01 | — |

TABLE 2-continued

| | Sn | Ag | Cu | Bi | In | Sb | Ni | Co | Others |
|---|---|---|---|---|---|---|---|---|---|
| Comparative Example 4 | Balance | 3.0 | 1.0 | 2.0 | 1.0 | 3.2 | 0.04 | 0.01 | — |
| Comparative Example 5 | Balance | 3.0 | 0.7 | 1.0 | 1.5 | 2.5 | 0.04 | 0.01 | — |
| Comparative Example 6 | Balance | 3.0 | 0.7 | 3.0 | 1.0 | 3.2 | 0.04 | 0.01 | — |
| Comparative Example 7 | Balance | 3.0 | 0.7 | 2.0 | 0.3 | 3.2 | 0.04 | 0.01 | — |
| Comparative Example 8 | Balance | 3.0 | 0.7 | 2.0 | 2.5 | 3.2 | 0.04 | 0.01 | — |
| Comparative Example 9 | Balance | 3.0 | 0.7 | 1.5 | 2.5 | 4.0 | 0.04 | 0.01 | — |
| Comparative Example 10 | Balance | 3.0 | 0.7 | 2.0 | 1.5 | 2.5 | 0.04 | 0.01 | — |
| Comparative Example 11 | Balance | 3.0 | 0.7 | 2.0 | 1.0 | 4.5 | 0.04 | 0.01 | — |
| Comparative Example 12 | Balance | 3.0 | 0.7 | 2.0 | 1.0 | 3.0 | — | 0.008 | — |
| Comparative Example 13 | Balance | 3.0 | 0.7 | 2.0 | 1.0 | 3.0 | 0.1 | 0.01 | — |
| Comparative Example 14 | Balance | 3.0 | 0.7 | 2.0 | 1.0 | 3.0 | 0.04 | — | — |
| Comparative Example 15 | Balance | 3.0 | 0.7 | 2.0 | 1.0 | 3.0 | 0.04 | 0.02 | — |
| Comparative Example 16 | Balance | 3.0 | 0.7 | 1.5 | 1.5 | 3.0 | 0.04 | 0.01 | 0.1 P |
| Comparative Example 17 | Balance | 3.0 | 0.7 | 1.5 | 1.5 | 3.0 | 0.04 | 0.01 | 0.1 Ge |
| Comparative Example 18 | Balance | 3.0 | 0.7 | 1.5 | 1.5 | 3.0 | 0.04 | 0.01 | 0.1 Ga |
| Comparative Example 19 | Balance | 3.0 | 0.7 | 1.5 | 1.5 | 3.0 | 0.04 | 0.01 | 0.1 Fe |
| Comparative Example 20 | Balance | 3.0 | 0.7 | 1.5 | 1.5 | 3.0 | 0.04 | 0.01 | 0.1 Mn |
| Comparative Example 21 | Balance | 3.0 | 0.7 | 1.5 | 1.5 | 3.0 | 0.04 | 0.01 | 0.1 Cr |
| Comparative Example 22 | Balance | 3.0 | 0.7 | 1.5 | 1.5 | 3.0 | 0.04 | 0.01 | 0.1 Mo |

(1) Solder Cracking Resistance Test
<Chip Component A>
The following tools were prepared.

A chip component with a size of 3.0 mm×1.6 mm (chip component A, Ni/Sn-plated)

A printed wiring board comprising a solder resist with a pattern on which the chip component with the size mentioned above can be mounted and an electrode (1.6 mm×1.2 mm) for connecting the chip component A metal mask with a thickness of 150 μm having the pattern mentioned above Each solder paste was subjected to printing on the respective printed wiring board by using the respective metal mask, and 10 chip components each mentioned above were installed on the board.

After that, a reflow furnace (product name: TNP-538EM; manufactured by Tamura Corporation) was used to heat each printed wiring board; thus, an electronic circuit mounting substrate comprising solder joints each of which electrically joined an electrode and the respective chip component was produced. For reflow conditions at this time, preheating was performed at 170° C. to 190° C. for 110 seconds, the peak temperature was set to 245° C., the time of 200° C. or more was set to 65 seconds, the time of 220° C. or more was set to 45 seconds, and the cooling rate from the peak temperature to 200° C. was set to 3° C. to 8° C./second. The oxygen concentration was set to 1,500±500 ppm.

Next, a thermal shock test tester (product name: ES-76LMS; manufactured by Hitachi Appliances, Inc.) that was set to conditions of −40° C. (30 minutes) to 175° C. (30 minutes) was used to expose each printed wiring board to an environment where the thermal shock cycle was repeated 2,000 or 3,000 times, and then the board was taken out; thus, a test substrate was obtained.

Next, a portion of interest of each test substrate was cut out, and was sealed with an epoxy resin (product name: Epomount (a main ingredient and a hardener); manufactured by Refine Tec Ltd.). Further, a wet polishing machine (product name: TegraPol-25; manufactured by Marumoto Struers K.K.) was used to create a state where a central cross section of the chip component mounted on each test substrate was clearly seen; a scanning electron microscope (product name: TM-1000; manufactured by Hitachi High-Technologies Corporation) was used to observe whether a crack had occurred in the solder joint of each chip component or not; evaluation was made by the following criteria. The results are shown in Table 3 and Table 4. The number of chip components for evaluation in each thermal shock cycle was set to 10.

⊚: A crack fully traversing the solder joint does not occur up to 3,000 cycles

◯: A crack fully traversing the solder joint occurs between 2,001 to 3,000 cycles x: A crack fully traversing the solder joint occurs at 2,000 cycles or less (1) Solder Cracking Resistance Test
<Chip Component B>

A solder cracking resistance test was performed under the same conditions as chip component A mentioned above except that the following tools were used, and evaluation was made by the same criteria. The results are shown in Table 3 and Table 4.

A chip component with a size of 2.0 mm×1.2 mm (chip component B, Ni/Sn-plated)

Figure 1:
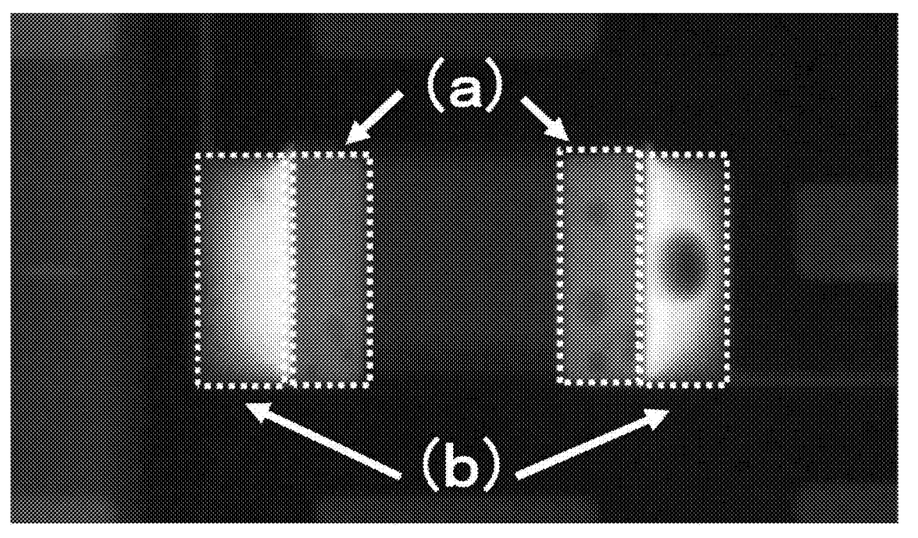
FIG. 1 is photographs of common chip component mounting substrates that are taken from the chip component side by using an X-ray transmission apparatus in order to show a "under-electrode region" and a "fillet region" where the presence or absence of the occurrence of a void is observed in each of (2) void checking tests in an Example and a Comparative Example of the present invention.

A printed wiring board comprising a solder resist with a pattern on which the chip component with the size mentioned above can be mounted and an electrode (1.25 mm×1.0 mm) for connecting the chip component (2) Void Checking Test Using chip components A, electronic circuit mounting substrates each comprising solder joints were produced under similar conditions to (1) Solder cracking resistance test mentioned above; the surface states were observed with an X-ray transmission apparatus (product name: SMX-160E; manufactured by Shimadzu Corporation); the average value of the area ratio of voids in a region under the electrode of the chip component (region (a) surrounded by the broken line of FIG. 1) (the proportion of the gross area of voids, the same applies hereinafter) and the area ratio of voids in a region where a fillet was formed (region (b) surrounded by the broken line of FIG. 1) was found in 40 lands of each electronic circuit mounting substrate; each substrate was evaluated in the following manner. The results are shown in Table 3 and Table 4.

⊚: The average value of the area ratios of voids is 3% or less

◯: The average value of the area ratios of voids is more than 3% and 5% or less

Δ: The average value of the area ratios of voids is more than 5% and 8% or less x: The average value of the area ratios of voids is more than 8%

TABLE 3

| | (1) Solder cracking resistance test | | (2) Void checking test | |
| --- | --- | --- | --- | --- |
| | Chip component A | Chip component B | Under-electrode region | Fillet region |
| Example 1 | ○ | ○ | △ | ○ |
| Example 2 | ◎ | ○ | △ | ○ |
| Example 3 | ◎ | ◎ | △ | ○ |
| Example 4 | ◎ | ◎ | △ | ○ |
| Example 5 | ◎ | ◎ | △ | △ |
| Example 6 | ○ | ○ | ○ | ○ |
| Example 7 | ◎ | ○ | ○ | ○ |
| Example 8 | ◎ | ○ | ○ | ○ |
| Example 9 | ◎ | ○ | ○ | ○ |
| Example 10 | ◎ | ○ | △ | ○ |
| Example 11 | ◎ | ○ | ○ | ○ |
| Example 12 | ◎ | ○ | ○ | ○ |
| Example 13 | ◎ | ○ | ○ | ○ |
| Example 14 | ◎ | ◎ | ○ | ○ |
| Example 15 | ◎ | ○ | △ | ○ |
| Example 16 | ◎ | ◎ | ○ | ○ |
| Example 17 | ◎ | ◎ | △ | ○ |
| Example 18 | ◎ | ○ | △ | ○ |
| Example 19 | ◎ | ○ | △ | ○ |
| Example 20 | ○ | ○ | △ | ○ |
| Example 21 | ○ | ◎ | ○ | ○ |
| Example 22 | ◎ | ◎ | ○ | ○ |
| Example 23 | ◎ | ○ | ○ | ○ |
| Example 24 | ○ | ○ | △ | △ |
| Example 25 | ◎ | ○ | △ | ○ |
| Example 26 | ◎ | ◎ | ○ | ○ |
| Example 27 | ◎ | ◎ | ○ | ○ |
| Example 28 | ◎ | ◎ | ○ | ○ |
| Example 29 | ◎ | ◎ | ○ | ○ |
| Example 30 | ◎ | ◎ | △ | ○ |
| Example 31 | ◎ | ◎ | ○ | ○ |
| Example 32 | ◎ | ◎ | △ | ○ |
| Example 33 | ◎ | ◎ | △ | ○ |

TABLE 4

| | (1) Solder cracking resistance test | | (2) Void checking test | |
| --- | --- | --- | --- | --- |
| | Chip component A | Chip component B | Under-electrode region | Fillet region |
| Comparative Example 1 | ◎ | ○ | X | ○ |
| Comparative Example 2 | ○ | ○ | X | △ |
| Comparative Example 3 | ○ | X | ○ | ○ |
| Comparative Example 4 | ◎ | ○ | △ | X |
| Comparative Example 5 | X | X | ○ | ○ |
| Comparative Example 6 | ○ | X | ○ | ○ |
| Comparative Example 7 | ○ | X | ○ | ○ |
| Comparative Example 8 | ○ | ○ | X | △ |
| Comparative Example 9 | ○ | ○ | X | △ |
| Comparative Example 10 | ○ | X | ○ | ○ |
| Comparative Example 11 | ○ | ○ | △ | △ |
| Comparative Example 12 | ○ | X | ○ | ○ |
| Comparative Example 13 | ○ | ○ | X | X |
| Comparative Example 14 | ○ | X | ○ | ○ |
| Comparative Example 15 | ○ | X | △ | X |
| Comparative Example 16 | X | X | X | X |
| Comparative Example 17 | X | X | X | X |
| Comparative Example 18 | X | X | X | X |
| Comparative Example 19 | X | X | X | X |
| Comparative Example 20 | X | X | X | X |
| Comparative Example 21 | X | X | X | X |
| Comparative Example 22 | X | X | X | X |

As shown above, it can be seen that, in the solder joints formed using the lead-free solder alloys according to the Examples, the progress of a crack can be suppressed even in a harsh environment with a very severe temperature variations, such as from −40° C. to 175° C. It can also be seen that each of the lead-free solder alloys according to the Examples can exhibit also the effect of suppressing the occurrence of a void in the solder joint formed using the alloy.

Thus, each of the lead-free solder alloys according to the Examples can suppress the effect of suppressing the progress of a crack in the solder joint in an environment with a very severe temperature variations and the occurrence of a void, and can therefore be suitably used even for an electronic circuit mounting substrate to be installed in an on-vehicle electronic control device.

Obviously, numerous modifications and variations of the present invention are possible in light of the above teachings. It is therefore to be understood that within the scope of the appended claims, the invention may be practiced otherwise than as specifically described herein.

What is claimed is:

1. A lead-free solder alloy for an on-vehicle electronic circuit mounting substrate comprising:
   2.0% by mass or more and 4.0% by mass or less of Ag;
   0.3% by mass or more and 0.7% by mass or less of Cu;
   1.7% by mass or more and 2.0% by mass or less of Bi;
   0.5% by mass or more and 2.1% by mass or less of In;
   3.0% by mass or more and 4.0% by mass or less of Sb;
   0.001% by mass or more and 0.05% by mass or less of Ni;
   0.001% by mass or more and 0.01% by mass or less of Co;
   optionally further comprising at least one of P, Ga, and Ge in a total amount of 0.001% by mass or more and 0.05% by mass or less;
   optionally further comprising at least one of Fe, Mn, Cr, and Mo in a total amount of 0.001% by mass or more and 0.05% by mass or less; and
   the balance being Sn.

2. The lead-free solder alloy according to claim 1, wherein an amount of Cu is 0.5% by mass or more and 0.7% or less.

3. The lead-free solder alloy according to claim 1, wherein an amount of In is 0.75% by mass or more and 2.1% by mass or less.

4. The lead-free solder alloy according to claim 2, wherein an amount of In is 0.75% by mass or more and 2.1% by mass or less.

5. The lead-free solder alloy according to claim 1, wherein an amount of Sb is 3.0% by mass or more and 3.8% by mass or less.

6. The lead-free solder alloy according to claim 3, wherein an amount of Sb is 3.0% by mass or more and 3.8% by mass or less.

7. A lead-free solder alloy comprising:
2.0% by mass or more and 4.0% by mass or less of Ag;
0.3% by mass or more and 0.5% by mass or less of Cu;
1.2% by mass or more and 2.0% by mass or less of Bi;
0.5% by mass or more and 2.1% by mass or less of In;
3.0% by mass or more and 4.0% by mass or less of Sb;
0.001% by mass or more and 0.05% by mass or less of Ni;
0.001% by mass or more and 0.01% by mass or less of Co;
optionally further comprising at least one of P, Ga, and Ge in a total amount of 0.001% by mass or more and 0.05% by mass or less;
optionally further comprising at least one of Fe, Mn, Cr, and Mo in a total amount of 0.001% by mass or more and 0.05% by mass or less; and
the balance being Sn.

\* \* \* \* \*